(12) United States Patent
Takeda et al.

(10) Patent No.: US 8,796,077 B2
(45) Date of Patent: Aug. 5, 2014

(54) SEMICONDUCTOR DEVICE

(71) Applicant: Elpida Memory, Inc., Tokyo (JP)

(72) Inventors: Hiromasa Takeda, Tokyo (JP); Satoshi Isa, Tokyo (JP); Mitsuaki Katagiri, Tokyo (JP); Dai Sasaki, Tokyo (JP)

(73) Assignee: PS4 Luxco, S.a.r.l., Luxembourg (LU)

( * ) Notice: Subject to any disclaimer, the term of this patent is extended or adjusted under 35 U.S.C. 154(b) by 0 days.

(21) Appl. No.: 14/034,254

(22) Filed: Sep. 23, 2013

(65) Prior Publication Data

US 2014/0094000 A1  Apr. 3, 2014

Related U.S. Application Data

(63) Continuation of application No. 12/776,070, filed on May 7, 2010, now Pat. No. 8,569,898.

(30) Foreign Application Priority Data

May 15, 2009  (JP) .................................. 2009-118306

(51) Int. Cl.
 *H01L 23/498*  (2006.01)
(52) U.S. Cl.
 USPC ..... 438/123; 257/784; 257/738; 257/E23.069
(58) Field of Classification Search
 USPC ................... 438/123; 257/784, 738, E23.069
 See application file for complete search history.

(56) References Cited

U.S. PATENT DOCUMENTS

| 8,569,898 B2* | 10/2013 | Takeda et al. ................. 257/784 |
| 2002/0096788 A1 | 7/2002 | Wang et al. |
| 2007/0262431 A1 | 11/2007 | Kuroda et al. |
| 2009/0032948 A1 | 2/2009 | Hsieh |
| 2010/0289141 A1* | 11/2010 | Takeda et al. ................. 257/738 |

FOREIGN PATENT DOCUMENTS

| JP | 2001-298039 | 10/2001 |
| KR | 2006074143 | 7/2006 |

OTHER PUBLICATIONS

Takeda et al., U.S. Office Action mailed Aug. 17, 2012, directed to U.S. Appl. No. 12/776,070; 16 pages.
Takeda et al., U.S. Office Action mailed Jan. 16, 2013, directed to U.S. Appl. No. 12/776,070; 20 pages.

* cited by examiner

*Primary Examiner* — Robert Carpenter (57) ABSTRACT

Provided is a semiconductor device with a semiconductor chip mounted on a small-sized package substrate that includes a slot, a large number of external connection terminals, and bonding fingers. The bonding fingers are connected to the external connection terminals. The bonding fingers constitute a bonding finger arrangement in a central section and end sections of a bonding finger area along each longer side of the slot. The arrangement includes a first bonding finger array, which is located at a close distance from each longer side of the slot, and a second array, which is located at a farther distance than the distance of the first bonding finger array from each longer side of the slot. The central section of the bonding finger area includes the second bonding finger array, and the end sections of the bonding finger area include the first bonding finger array.

16 Claims, 10 Drawing Sheets

Example of design standard values

|   | Design standard value |
|---|---|
| θ | Within 45° |
| A | MIN : 150um |

A : Bonding finger pitch
θ : Angle formed between die pad center and wire

SEMICONDUCTOR DEVICE

This application is a continuation of U.S. patent application Ser. No. 12/776,070, filed May 7, 2010, which claims the benefit of priority from Japanese patent application No. 2009-118306, filed on May 15, 2009, the disclosures of which are incorporated herein in their entireties by reference.

BACKGROUND OF THE INVENTION

1. Field of the Invention

This invention relates to a semiconductor device, and more particularly, to a semiconductor device of small package structure that has a large number of external connection terminals.

2. Description of the Related Art

With enhancement in function of semiconductor devices, there has been a great increase in circuit scale and the number of terminals for connection with an outside. While the number of terminals for connecting with the outside has increased greatly, a goal set for semiconductor devices is size reduction. To achieve this goal, various small-sized packages have been developed. An example of inexpensive small-sized packages is window ball grid array (wBGA) packages.

Figure 1A:
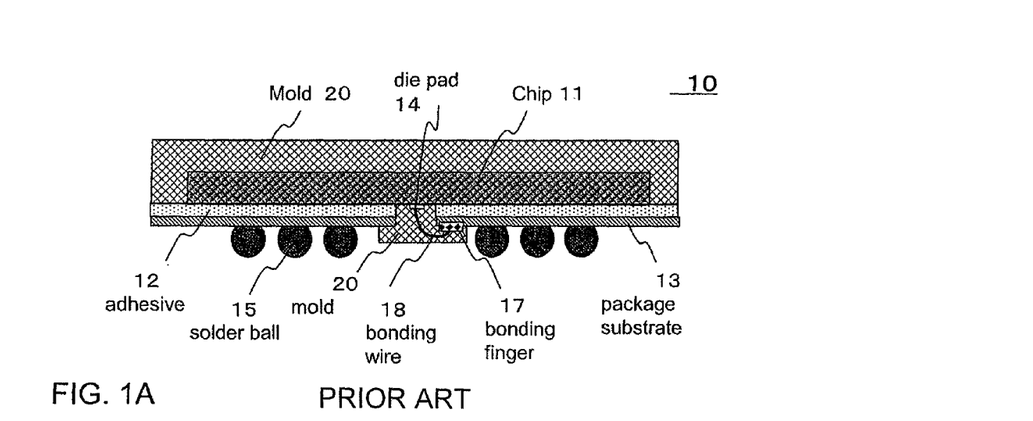
FIGS. 1A and 1B are a structural diagram illustrating in section a semiconductor device that has a wBGA package structure and a plan view illustrating a wiring layout of a package substrate, respectively.
Figure 1B:
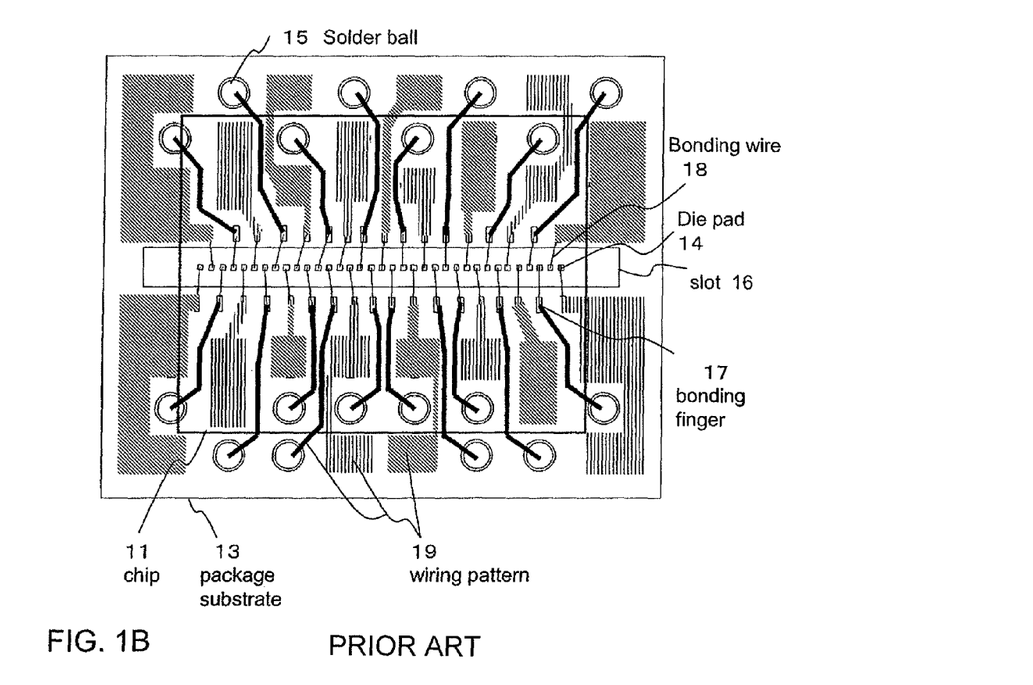

FIGS. 1A and 1B illustrate a sectional structure of a semiconductor device having a wBGA package structure and a wiring layout plan view of its package substrate, respectively. A semiconductor device 10 includes a chip 11, which is bonded facedown to a surface of a package substrate 13 via an adhesive 12. The chip 11 includes die pads 14 for bonding in the middle. The package substrate 13 includes solder balls 15 as external connection terminals, and has a slot 16 formed by cutting out a part of the substrate such that the die pads 14 of the chip 11 are exposed in the middle of the substrate. The slot 16 is a space where the package substrate 13 is cut out, and lines along which the substrate is cut out are referred to as the four sides of the slot 16.

On the bottom surface of the package substrate 13, bonding fingers 17 for bonding are provided in an area adjoining the longitudinal sides of the slot 16 and arranged along those sides. The die pads 14 of the chip 11 and the bonding fingers 17 of the package substrate 13 are connected to each other through the slot 16 by bonding wires 18. Further, the package substrate 13 includes on its bottom surface a plurality of the solder balls 15 as external connection terminals. The solder balls 15 and the bonding fingers 17 are connected to each other by wiring patterns 19. Of the wiring patterns 19, ones related to power sources such as a high-power source (VDD) and a grounded power source (VSS) employ wide wiring lines in order to reduce impedance and control noise. The wiring patterns related to power sources are therefore grouped together and illustrated in FIG. 1B as hatched, or vertically striped, wide wiring patterns 19 along with the solder balls 15. The semiconductor device 10 also includes molds 20, which respectively protect the rear side of the chip 11 and the slot portion.

The chip 11 is bonded to a surface of the package substrate 13 that is opposite from the surface where the solder balls 15 are provided (attached to the top surface of the substrate) with the use of the adhesive 12. The chip 11 is bonded such that the die pads 14 of the chip 11 are disposed in the middle of the slot 16 of the package substrate 13. The slot 16 is created by cutting out the middle part of the package substrate 13, and the die pads 14 on the chip 11 and the bonding fingers 17 on the substrate are arranged along the longitudinal sides of the slot 16 on a one-on-one basis. The die pads 14 and the bonding fingers 17 are connected by bonding with the use of the bonding wires 18.

In this manner, in a wBGA package, external connection terminals (solder ball terminals) and bonding fingers are disposed on the same surface of a package substrate and connected to each other by substrate wiring patterns. The opposite surface of the package substrate is a chip mount surface on which a chip is mounted. The chip is mounted such that die pads provided in the middle of the chip are disposed in the middle of a slot cut in the substrate. The die pads of the chip and the bonding fingers are connected by wire bonding through this slot.

Figure 2:
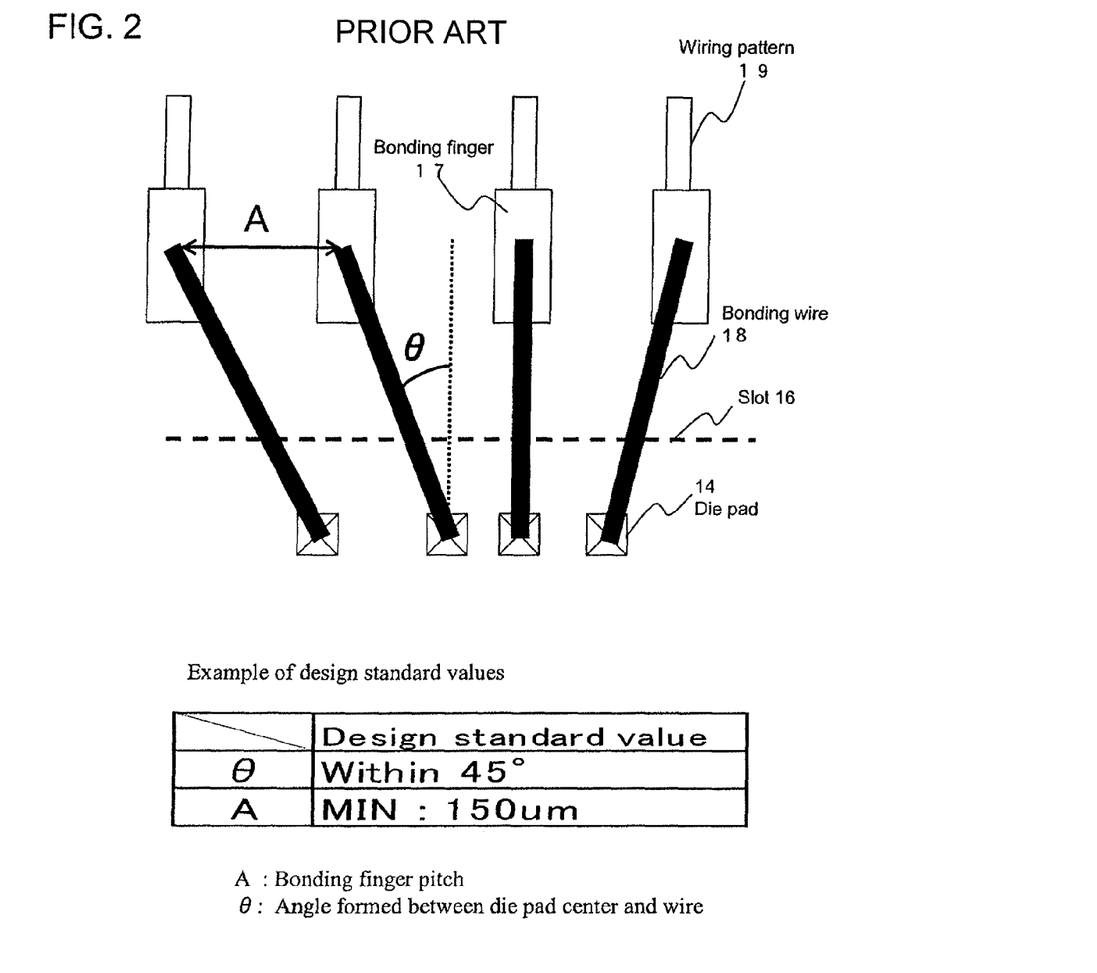
FIG. 2 is an explanatory diagram illustrating an example of wBGA package design standards.

A wBGA package is a low-cost package and is designed based on design standards, an example of which is illustrated in FIG. 2. For example, an angle θ of the bonding wires 18 is prescribed in order to avoid interference with the die pads 14 adjacent to the wires. As illustrated in FIG. 2, the angle θ is an angle that each bonding wire 18 forms with each straight line (dotted line of FIG. 2) which runs through the center of each die pad and intersects vertically a straight line (not shown) on which respective pads are aligned. The bonding wire angle θ is within 45° in an example of the design standards. A pitch A which defines the interval between bonding fingers is derived from the size of a capillary employed (tool used in bonding), and is prescribed in order to prevent the capillary from coming into contact with the wires. The bonding finger pitch A is 150 μm at minimum in an example of the design standards.

Japanese Unexamined Patent Application Publication (JP-A) No. 2001-298039 (Patent Document 1) discloses a chip-size semiconductor device which makes high-density packaging possible. The semiconductor device has a structure in which external electrode terminals are provided on the bottom surface of a semiconductor carrier, a plurality of electrodes arranged in a staggered pattern and electrically connected to the external electrode terminals are disposed on the top surface of the semiconductor carrier along with a semiconductor element, and the staggered electrodes and electrodes on the semiconductor element are connected by wires. With the staggered arrangement of electrodes, the area that the wiring takes up is prevented from expanding beyond the extent of the semiconductor element, thereby reducing the semiconductor device in size.

SUMMARY

With the recent reduction in chip size and increase in bit count, the limiting conditions set by the design standards are making it very difficult to lay out package wiring patterns in a small-sized package having a large number of external connection terminals. Consequently, when securing the wiring area is given priority in arranging bonding fingers, the prescribed wire angle θ is exceeded despite the bonding finger pitch A (in FIG. 2) being set to its minimum value, and the package thus fails in following the design standards.

Employing the staggered bonding finger arrangement of Patent Document 1 in a wBGA package satisfies the standards set for the bonding wire angle θ but gives rise to a problem in that wiring areas are not secured at the ends of the bonding finger rows. Consequently, the staggered bonding finger arrangement of Patent Document 1 cannot be employed in a small-sized wBGA package having a large number of external connection terminals as it is.

The invention seeks to solve one or more of the problems in semiconductor devices described above.

In one embodiment, there is provided a semiconductor device, comprising: a package substrate which includes: a substrate with a slot formed in a part of the substrate; external connection terminals formed on a bottom surface of the substrate; and a bonding finger arrangement formed in a central section and end sections of a bonding finger area on the bottom surface of the substrate along each longer side of the slot, and including a plurality of bonding fingers which are connected to the external connection terminals; and a chip mounted on a top surface of the package substrate, in which: the bonding finger arrangement includes a first bonding finger array, which is located at a close distance from the each longer side of the slot, and a second bonding finger array, which is located at a distance farther than the distance of the first bonding finger array from the each longer side of the slot; the central section of the bonding finger area includes the second bonding finger array; and at least one of the end sections of the bonding finger area includes the first bonding finger array.

In another embodiment, there is provided a semiconductor device, comprising: a semiconductor chip; and a package substrate which has a first surface to mount the semiconductor chip and a second surface on an opposite side of the package substrate from the first surface, the second surface having external connection terminals formed thereon as well as bonding fingers, which are connected to die pads of the semiconductor chip through a slot that allows the first surface and the second surface to communicate with each other, wherein: the bonding fingers are distributed among a first area, which is a central area, and a second area and a third area which are on respective sides of the first area; and the bonding fingers in the first area are arrayed linearly at a given distance from one longer side of the slot whereas the bonding fingers in the second area and the third area are arrayed linearly at a closer distance from the one longer side of the slot with respect to the bonding fingers in the first area.

In one embodiment, there is provided a package substrate, comprising: a substrate with a slot formed in a part of the substrate; external connection terminals formed on a bottom surface of the substrate; and a bonding finger arrangement formed in a central section and end sections of a bonding finger area on the bottom surface of the substrate along each longer side of the slot, and including a plurality of bonding fingers which are connected to the external connection terminals, wherein: the bonding finger arrangement includes a first bonding finger array, which is located at a close distance from the each longer side of the slot, and a second bonding finger array, which is located at a distance farther than the distance of the first bonding finger array from the each longer side of the slot; the central section of the bonding finger area includes at least the second bonding finger array; and at least one of the end sections of the bonding finger area includes the first bonding finger array.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF EXEMPLARY EMBODIMENTS

Before describing of the present invention, the problems of the related art will be explained in detail with reference to several drawings to facilitate the understanding of the present invention.

Figure 3A:
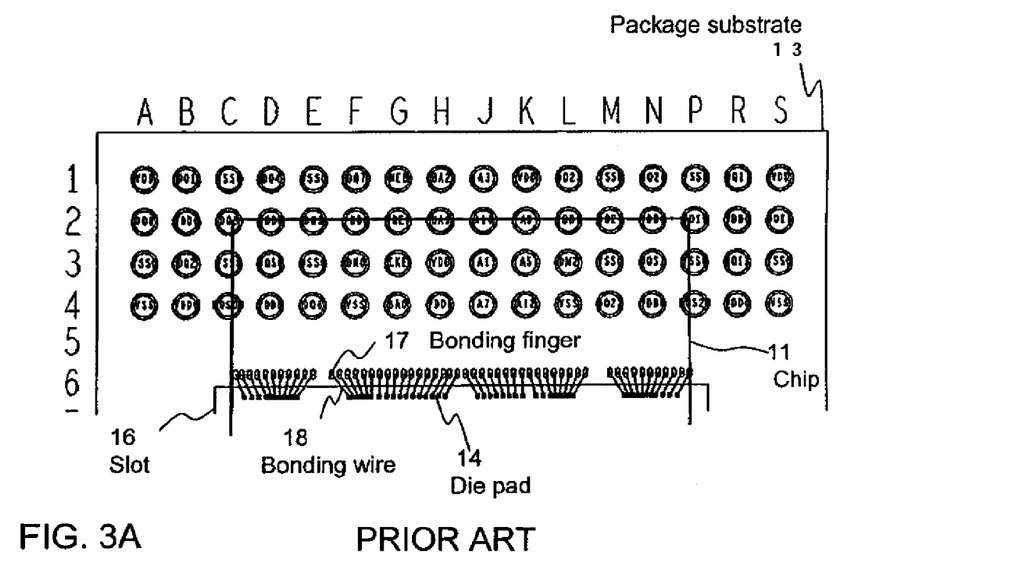
FIGS. 3A and 3B are explanatory diagrams of an angle of a bonding wire which connects a die pad to a bonding finger, with FIG. 3A illustrating the wire angle before a chip size reduction and FIG. 3B illustrating the wire angle after the chip size reduction.
Figure 3B:
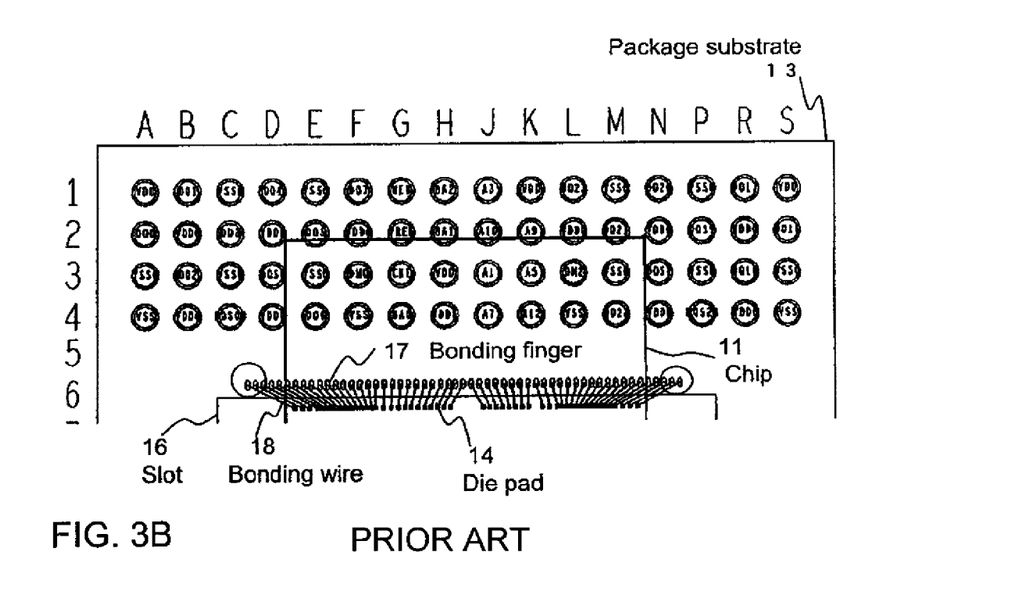

Referring to FIGS. 3A and 3B, explanation will be made of a problem that arises from a reduction in chip size, and referring to FIGS. 4A and 4B, a problem that arises from an increase in bit count will be explained.

In a wBGA package, solder balls are arranged above and below a slot in the middle in a substantially symmetrical manner. For example, FIGS. 3A and 3B illustrate sixteen columns (from A to S) by four rows of solder balls and, though not illustrated in FIGS. 3A and 3B, the opposite side across the slot similarly has four rows of solder balls. A package illustrated in FIG. 4A has solder balls arranged in fifteen columns (from A to R) by three rows above a slot. Some of the solder balls above the slot, ones in the columns K, M, and P on the first row, are missing, and some of solder balls below the slot (not shown), the ones in the columns L, N, and R on the sixth row, are missing. However, because the solder balls above and below the slot are substantially symmetrical with each other, only upper half solder balls are discussed in the following description and illustrated in the drawings.

FIGS. 3A and 3B are explanatory diagrams on the angle of a bonding wire that connects a die pad and a bonding finger to each other, with FIG. 3A illustrating the bonding wire angle before a chip size reduction and FIG. 3B illustrating the bonding wire angle after the chip size reduction. In FIG. 3A where the chip size has not been reduced, the chip size in the lateral direction corresponds to the interval between the column C and the column P. The distance between one die pad 14 and the bonding finger 17 that is associated with this die pad 14 is close, the length of the bonding wires 18 is short, and the bonding wire angle θ meets the design standard value. On the other hand, in FIG. 3B where the chip size has been reduced, the interval between the column D and the column N corresponds to the reduced lateral chip size. The reduced chip size has made the die pads 14 gather toward the center of the package and, in each of circled areas at the slot ends, the angle θ of the bonding wire 18 relative to the bonding finger 17 no longer meets the design standard value.

Figure 4A:
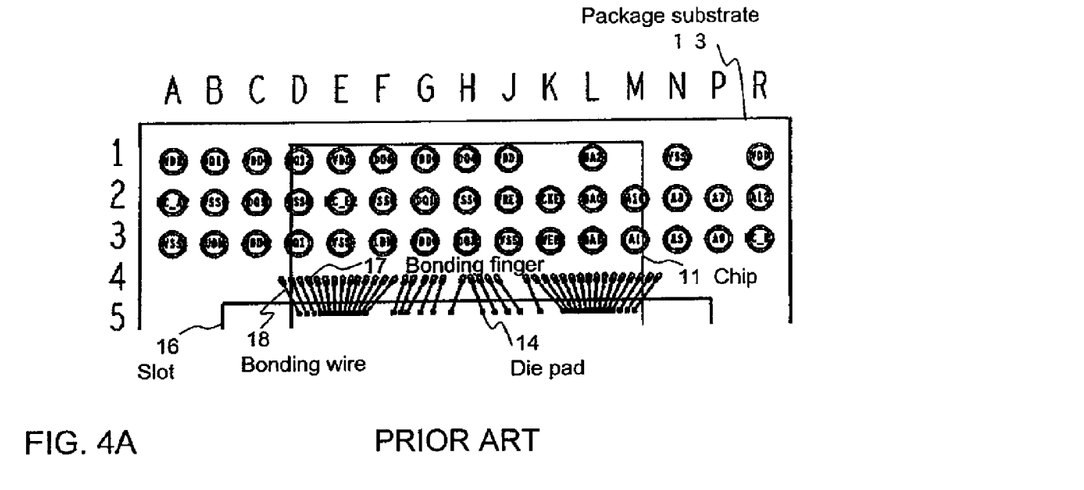
FIGS. 4A and 4B are explanatory diagrams of the angle of the bonding wire which connects the die pad to the bonding finger, with FIG. 4A illustrating the wire angle in a 16-bit product and FIG. 4B illustrating the wire angle in a 32-bit product.
Figure 4B:
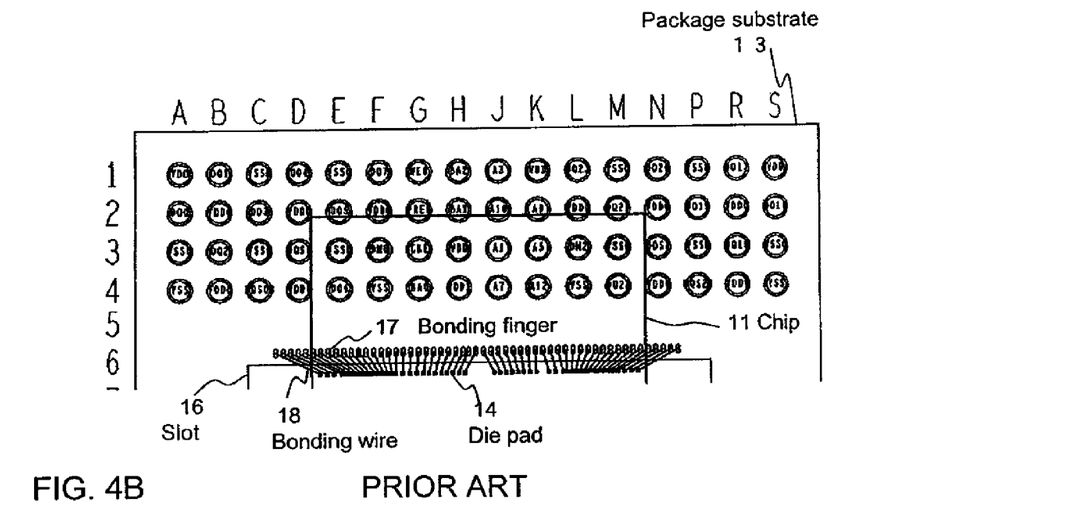

FIG. 4A is an explanatory diagram of the wire angle in, for example, a 16-bit Double Data Rate 2 (DDR2: one of dynamic random access memory systems) product, and FIG. 4B is an explanatory diagram of the wire angle in a 32-bit DDR2 product. In the case of the 16-bit product of FIG. 4A, the number of bonding fingers is forty, which allows the bonding fingers 17 to be positioned relative to the die pads 14 with room to spare, and the angle θ of the bonding wires 18 meets the design standard value. In the 32-bit product of FIG. 4B, the number of bonding fingers is fifty-five and a large number of bonding fingers 17 have to be disposed in an area outside the chip 11 as well, with the result that the angle θ of the bonding wire 18 in relation to its connected bonding finger 17 fails to meet the design standard value in each of the slot end areas.

Reducing the chip size thus makes the package substrate size larger relative to the chip size. In the case of a high-multiple bit product which needs more bonding fingers, a large number of bonding fingers are disposed further from the edges of the chip 11 toward the slot ends, resulting in the wide interval between the bonding fingers at the farthest slot ends and their associated die pads of the chip. As a result, a bonding wire that connects a bonding finger at one of the farthest slot ends with its associated die pad of the chip has a large angle θ, which makes it difficult to satisfy the standard set for the wire angle θ.

In addition, because bonding fingers and external terminals are disposed on the same surface of a substrate in a wBGA package, when the number of external terminals is large, some of the external terminals are disposed in areas by the left and right edges of the substrate, and securing a wiring area for connecting those external terminals in the substrate edge areas with bonding fingers is a problem that poses a challenge.

The problem of securing the wiring area is described with reference to FIG. 5A, which is a package substrate wiring pattern diagram illustrating the relation between the wiring area and a bonding finger area, and FIG. 5B, which is a diagram illustrating a problem that arises in FIG. 5A.

Figure 5A:
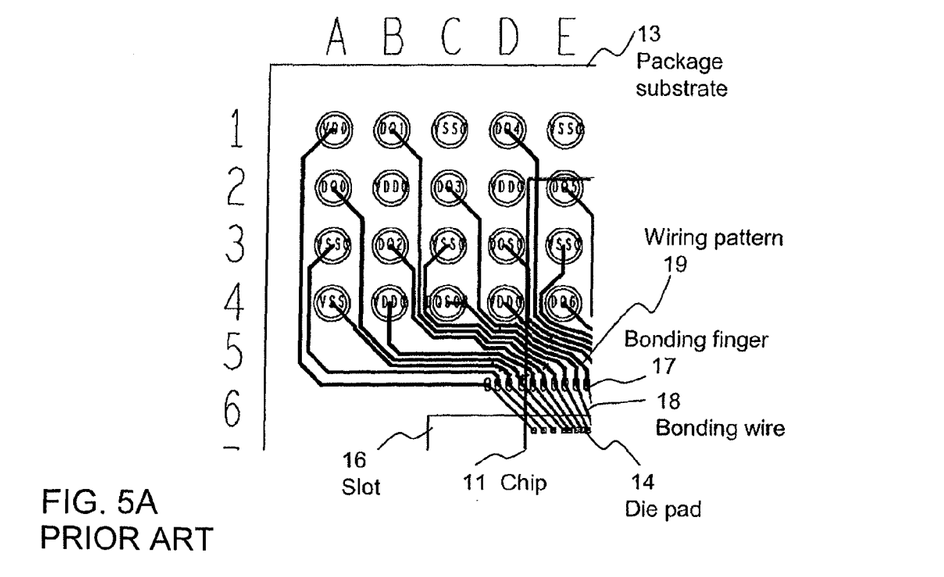
FIGS. 5A and 5B are respectively a package substrate wiring pattern diagram and explanatory diagram illustrating a relation between a wiring area and a bonding finger area.
Figure 5B:
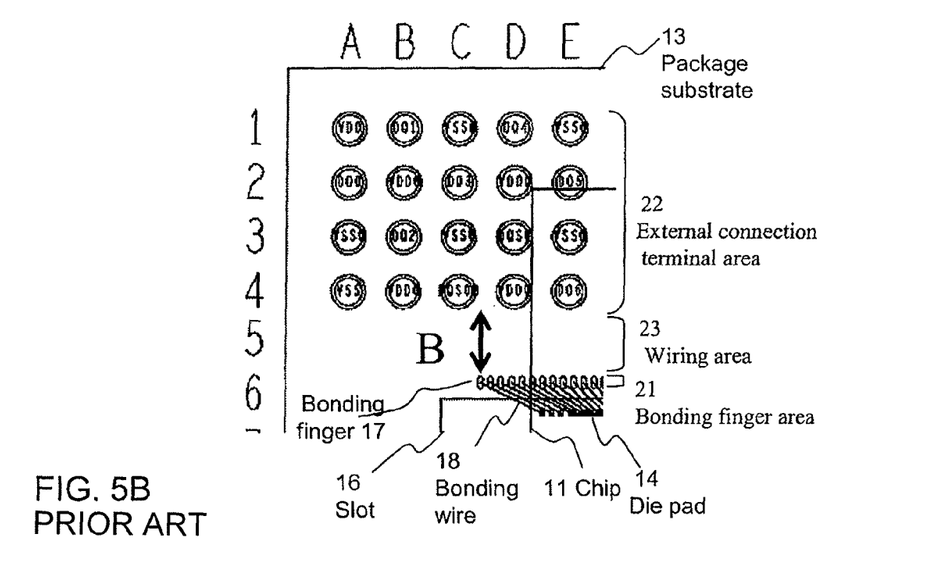

In FIG. 5A, the left edge of the chip 11 is located between the solder ball columns D and E, closer to the solder ball column D. Nine wiring patterns 19 in total need to be laid out between the bonding fingers 17 aligned in single file and the solder ball in the column D on the fourth row, for connection with the solder balls in the columns A, B, and C. A wiring area 23 therefore needs to be set between a bonding finger area 21 and an external connection terminal area 22 as illustrated in FIG. 5B. A wiring width B of the wiring area 23 depends on how many wiring patterns are necessary. When the number of wiring patterns needed is small, the wiring width B can be narrow to dispose bonding fingers close to the external connection terminal area 22. When the number of wiring patterns needed is large, on the other hand, the wiring width B has to be wide to dispose bonding fingers near the edge of the slot 16.

A staggered arrangement of bonding fingers as in Japanese Unexamined Patent Application Publication (JP-A) No. 2001-298039 (Patent Document 1) prevents bonding wires from expanding in the lateral direction but, when applied to a semiconductor device that is structured to dispose external connection terminals and bonding fingers on the same surface of a substrate, there arises a problem of securing an area for connecting the external connection terminals and the bonding fingers. In other words, a staggered bonding finger arrangement puts limitations on wiring areas for connecting external connection terminals that are disposed in areas by the left and right edges of the substrate with bonding fingers in a semiconductor device that has a large number of external connection terminals.

Figure 6:
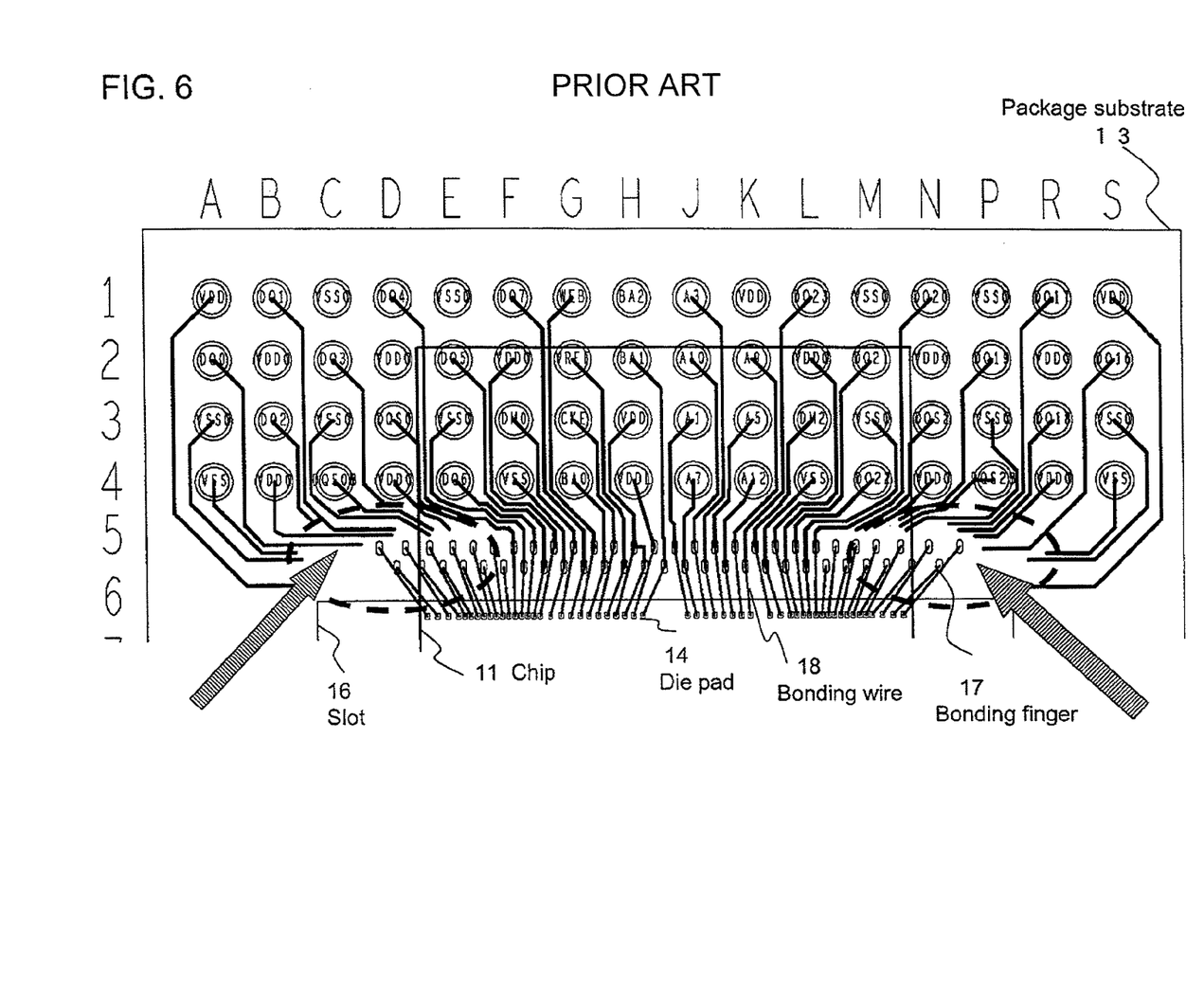
FIG. 6 is an explanatory diagram of a problem that arises when bonding fingers are arranged in a staggered pattern.

FIG. 6 is a diagram illustrating the wiring area problem which arises when a wBGA package employs the staggered bonding finger arrangement of Patent Document 1. The bonding fingers 17 are arranged into two staggered rows. With the bonding fingers 17 staggered in such a manner, the bonding wires 18 connecting the die pads 14 and the bonding fingers 17 can have a small angle θ that meets the standards. However, arranging the bonding fingers 17 into two rows makes the bonding finger area large, thereby sacrificing wiring areas and narrowing the wiring width B of the wiring areas. As a result, necessary wiring patterns cannot be disposed in areas circled with the broken lines which are at the ends of bonding finger rows and by the left and right edges of the package substrate.

Thus, employing the staggered bonding finger arrangement of Patent Document 1 in a wBGA package satisfies the standards set for the bonding wire angle θ but gives rise to a problem in that wiring areas are not secured at the ends of the bonding finger rows. Consequently, the staggered bonding finger arrangement of Patent Document 1 cannot be employed in a small-sized wBGA package having a large number of external connection terminals as it is.

Exemplary embodiments of this invention are described below in detail.

First Exemplary Embodiment

Figure 7A:
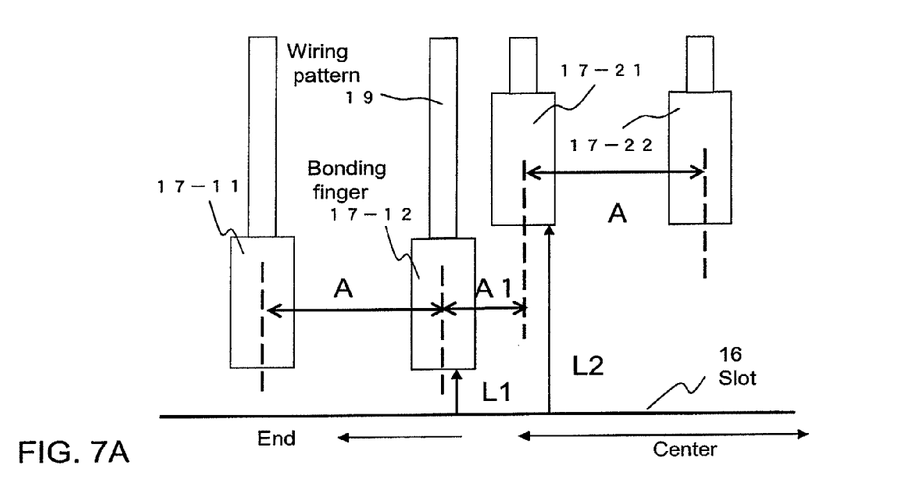
FIGS. 7A and 7B are an enlarged view illustrating a concept of how bonding fingers are arrayed in a first embodiment and an array concept diagram, respectively.
Figure 7B:
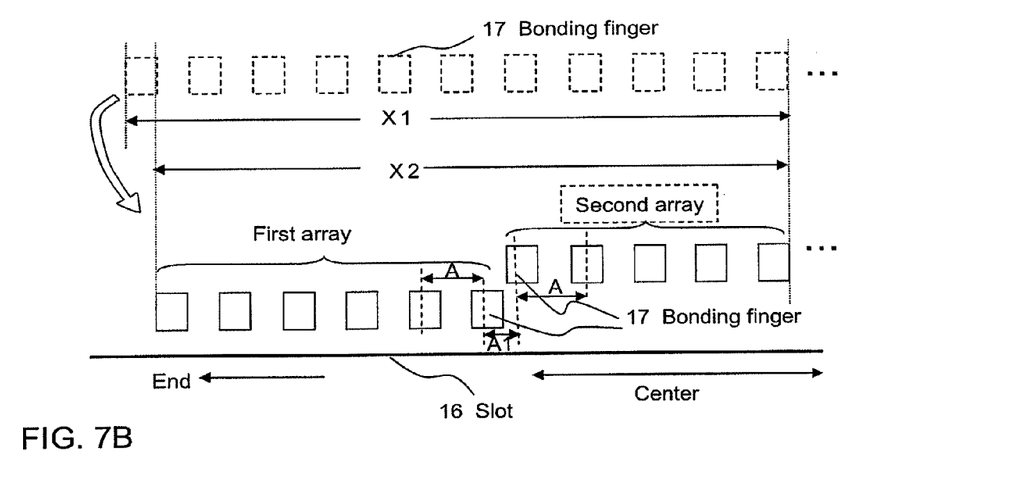
Figure 8A:
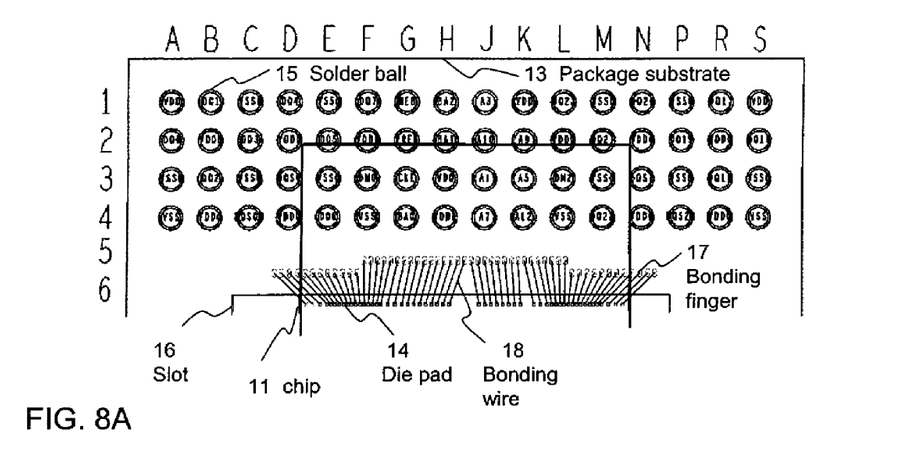
FIGS. 8A and 8B are a plan view of a wBGA package structure to which the array of FIGS. 7A and 7B is applied and a plan view of the wBGA package structure that includes wiring patterns, respectively.
Figure 8B:
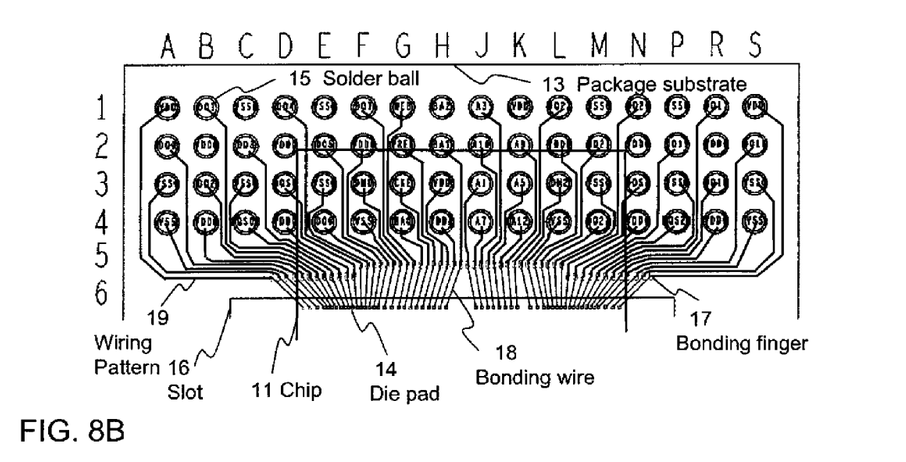

A detailed description of a first embodiment of this invention is given with reference to the drawings. FIGS. 7A and 7B are an enlarged view illustrating a concept of how bonding fingers are arrayed in the first embodiment and an array concept diagram, respectively. FIGS. 8A and 8B are a plan view of a wBGA package structure to which this array is applied and a plan view of the wBGA package structure that includes wiring patterns, respectively.

In FIG. 7A, a package substrate has a slot 16, which is created by cutting out a part of a middle portion of the substrate, and bonding fingers 17-11, 17-12, 17-21, and 17-22 (also simply designated as 17) are disposed on the substrate along a longer side of the slot 16. The bonding fingers 17-11 and 17-12 and the bonding fingers 17-21 and 17-22 are located at a distance L1 and a distance L2, respectively, from the longer side of the slot 16. The bonding fingers 17-21 and 17-22 which are in a central area (an area around the center point of the substrate) are located at the distance L2 from the side of the slot (edge). The bonding fingers 17-11 and 17-12 which are in a slot end area are located at the distance L1 from the side of the slot (edge). The distance L1 is shorter than the distance L2, and hence the bonding fingers 17-11 and 17-12 in the slot end area are disposed in an area close to the side of the slot (edge).

An arrangement of bonding fingers includes a first bonding finger array (alternatively abbreviated as "first array") and a second bonding finger array (alternatively abbreviated as "second array"). The central area or section of a bonding finger area has the second bonding finger array while the slot end area or section of the bonding finger area has the first bonding finger array in this embodiment. The first bonding finger array includes at least the bonding fingers 17-11 and 17-12 in the slot end area, is distanced from the side of the slot by L1 and has a bonding finger pitch A. The second bonding finger array includes at least the bonding fingers 17-21 and 17-22 in the central area, is distanced from the side of the slot by L2, and has the bonding finger pitch A, At a border between the first bonding finger array and the second bonding finger array section where their difference in distance from the slot creates a level difference, the bonding finger pitch is A1. The term "pitch" herein means the distance between the center points of two bonding fingers, not the interval (space) between one bonding finger and another.

As an example, it can be assumed that the bonding finger pitch A in the first and second bonding finger arrays is 150 μm, the center distance between the bonding finger at the end of the first bonding finger array and the bonding finger at the end of the second bonding finger array (the bonding finger pitch at the array border) A1 is 100 μm, the distance L1 from the longer side of the slot to the bonding fingers in the first array is 75 μm, and the distance L2 from the longer side of the slot to the bonding fingers in the second array is 275 μm. With a level difference created by disposing the first array and the second array at different distances from the side of the slot in a manner that prevents an overlap between the bonding fingers in the first array and the bonding fingers in the second array, the distance A1 in the level difference part (border) between the first array and the second array can be set smaller than the bonding finger pitch A in the first and second bonding finger arrays.

FIG. 7B is a conceptual diagram illustrating how bonding fingers are arrayed. The upper part of FIG. 7B illustrates for comparison a case in which bonding fingers are arranged into one row at a constant distance from the side of the slot. The lower part of FIG. 7B illustrates the bonding finger arrangement of this embodiment in which bonding fingers are arranged into two rows at different distances from the side of the slot. In the upper part of FIG. 7B, an array distance (array length) from the array center point of the single-row bonding finger array to the bonding finger at one end of the array is denoted by X1. In the lower part of FIG. 7B, an array distance from the array center point of a double-row bonding finger array to the bonding finger at one end of the array is denoted by X2. The bonding finger interval A1 is narrower at the border between the first bonding finger array and the second bonding finger array in the case of the double-row bonding finger array with a level difference, which makes X2 smaller than X1. The double-row bonding finger array with a level difference also has the same level difference to the right side of the center point. Accordingly, the bonding finger array distance in the double-row bonding finger array is shorter than that in the single-row array by 2(X1−X2).

The capability of a bonding machine used determines the bonding finger interval pitch (if the interval between bonding fingers is too close, the capillary comes into contact with a wire during bonding). However, in this case, a bonding finger arrangement includes a first bonding finger array and a second bonding finger array which are located on the first row and second row at different distances from the longer side of the slot, and creates a level difference. By separating the bonding fingers into two rows, the bonding finger interval A1 in the level difference portion at the array border can be set short while the distance A between adjacent bonding fingers in the same array is maintained. The overall array length can thus be shortened creating the level difference between the first bonding finger array and the second bonding finger array.

Shortening the overall array length makes the wire angle θ smaller and fall within a range set by the standards.

A semiconductor device having a wBGA package structure to which the bonding finger array with a level difference is applied is described with reference to FIGS. 8A and 8B, which are a plan view of the semiconductor device and a plan view of the semiconductor device that includes wiring patterns 19, respectively. External connection terminals (solder balls 15) and the bonding fingers 17 are disposed on the same surface of a package substrate 13, and the wiring patterns 19 connect the solder balls 15 and the bonding fingers 17 to each other. Die pads 14 on a chip 11 are connected to the bonding fingers 17 by bonding wires 18 through the slot 16 cut in the package substrate 13.

The bonding fingers 17 are arranged in the slot end area and the central area as a first bonding finger array which is the first-row array and as a second bonding finger array which is the second-row array, respectively. Creating a level difference in an array of the bonding fingers 17 in this manner makes the overall array distance of the bonding fingers 17 shorter. Further, arranging the bonding fingers that are in the slot end area in the first-row array which is close to the slot widens a wiring area between the bonding finger area and the external connection terminals. As a result, a large number of wiring patterns can be laid out in the slot end area.

The semiconductor device is described further with reference to FIG. 8B. The bonding wire angle in the central area is 0° or a slight tilt toward the substrate center, and hence the wiring patterns are connected substantially vertically to the solder balls from the bonding fingers. With the wiring patterns in the central area thus wired substantially vertically, the bonding fingers in the second array can be wired despite their wiring area being narrow.

On the other hand, the bonding wire angle in the slot end area is inclined toward the slot end. The wiring patterns in the slot end area are led out in the horizontal direction once and then connected to solder balls in the vertical direction. Although the wiring patterns in the slot end area need to be led out in the horizontal direction once, arranging the bonding fingers in the slot end area closer to the slot widens the wiring area in the slot end area, and hence a large number of wiring patterns can be laid out.

As described above, in a wBGA package, a package substrate has a slot formed by cutting out a part of the middle of the substrate, and die pads on a chip and bonding fingers on the substrate are arranged along the longer side of the slot (in the lateral direction in the drawings). According to this embodiment, of the array of bonding fingers arranged in the direction of the longer side of the slot, bonding fingers disposed in the central area of the array may be called central bonding fingers (bonding fingers in the central area), and bonding fingers disposed in an end area on each side of the central area may be called end bonding fingers (bonding fingers in a slot end area).

However, those central area and slot end areas are not limited strictly to the above-mentioned definition. For example, in FIG. 6 where bonding fingers are staggered, the central area may be an area in which securing a wiring space is easy while an area on each side of this area where securing a wiring space is difficult may be called the slot end area. Accordingly, the central area and the slot end area are better defined as an area in which the position of a bonding finger in the lateral direction of the drawing is closer to the package substrate center than the position of its associated die pad on the chip is (or equally distanced from the substrate center as the die pad is) and as an area in which the position of a bonding finger is closer to the left or right edge of the package substrate than the position of its associated die pad on the chip is, respectively. The extent of the central area and the extent of the slot end area therefore vary depending on the number of terminals in the package and on the chip size. As areas in which bonding fingers are disposed, the central area may be referred to as a "first area," and slot end areas on the respective sides of the central area (first area) may be referred to as a "second area" and a "third area."

In this embodiment, arrays of bonding fingers in the slot end areas and in the central area are disposed to provide level difference. By creating a level difference between an array of bonding fingers in the central area and an array of bonding fingers in each slot end area, the overall array length of the bonding fingers may be shortened. The bonding wire angle standard can therefore be satisfied. Further, setting up the bonding finger arrays in the slot end areas close to the slot side widens the wiring areas between solder balls and bonding fingers. With the wiring areas set wide in the slot end areas where a large number of wiring lines are necessary to wire solder balls and bonding fingers to each other, a large number of wiring patterns can be laid out. Bonding wires that connect bonding fingers at the farthest ends to their associated die pads of the chip consequently have a small angle θ, and the design standards set for the angle θ is satisfied easily. This embodiment thus provides a low-cost, multi-pin semiconductor device that can be reduced in size.

Second Exemplary Embodiment

Figure 9A:
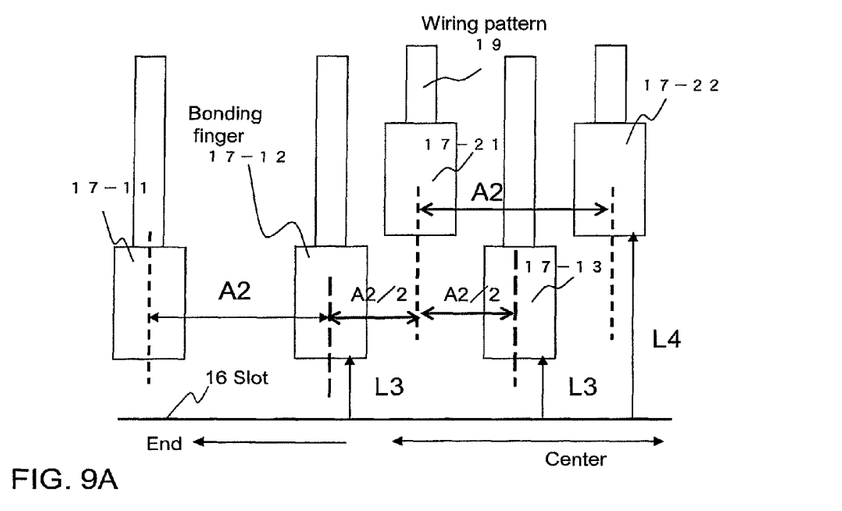
FIGS. 9A and 9B are an enlarged view illustrating a concept of how bonding fingers are arrayed in a second embodiment and an array concept diagram, respectively.
Figure 9B:
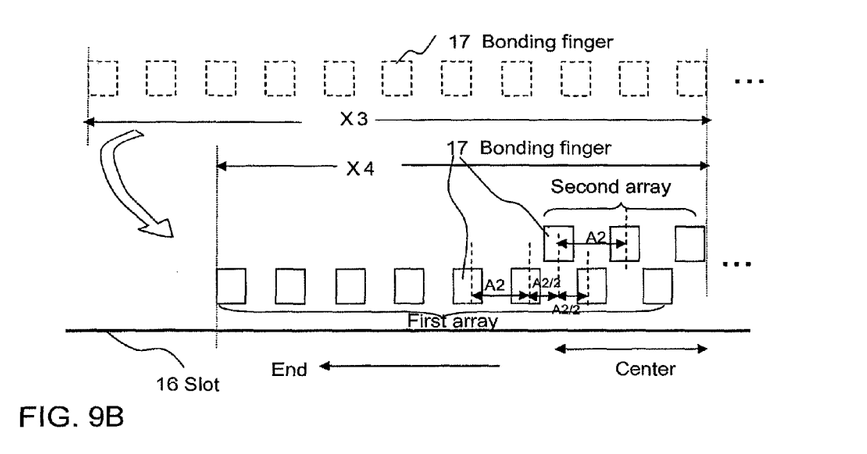
Figure 10A:
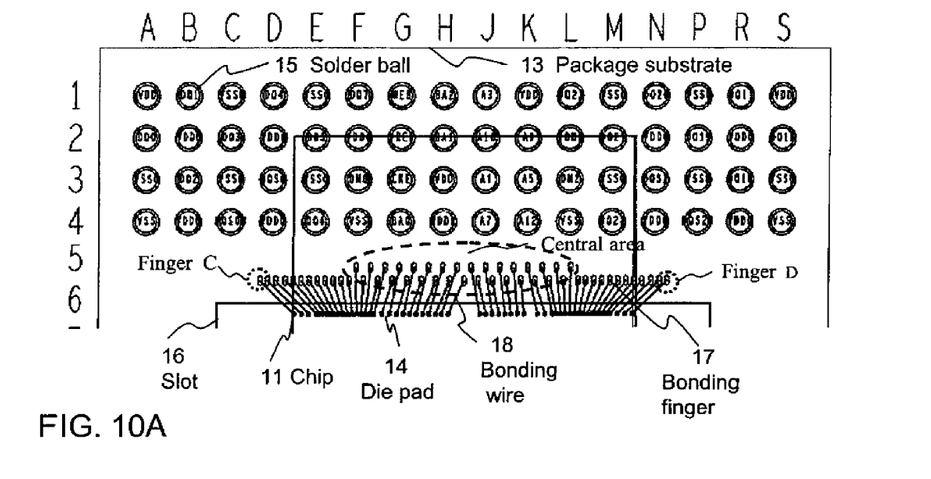
FIGS. 10A and 10B are a plan view of a wBGA package structure to which the array of FIGS. 9A and 9B is applied and a plan view of the wBGA package structure that includes wiring patterns, respectively.
Figure 10B:
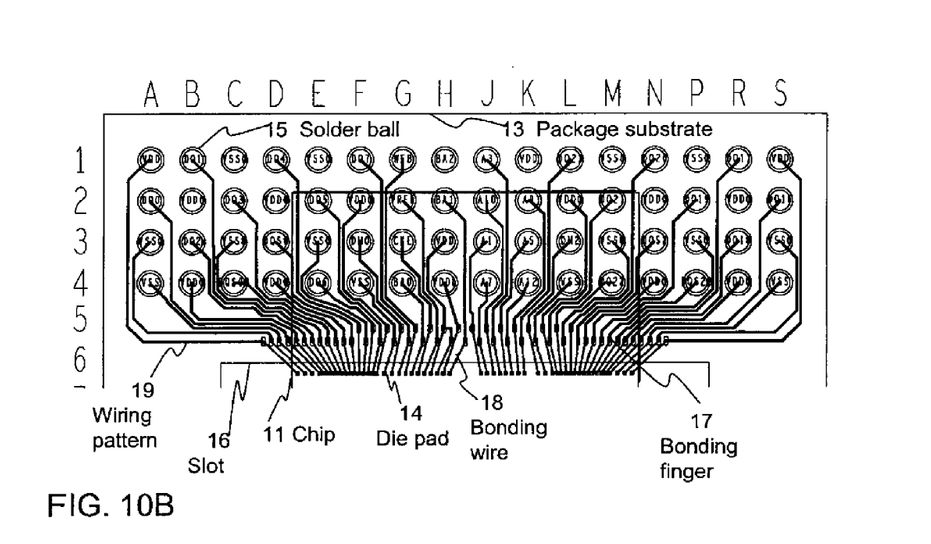

A detailed description of a second embodiment of this invention is given with reference to the drawings. FIGS. 9A and 9B are an enlarged view illustrating a concept of how bonding fingers are arranged in the second embodiment and an array concept diagram, respectively. FIGS. 10A and 10B are a plan view of a wBGA package structure to which this array is applied and a plan view of the wBGA package structure that includes wiring patterns, respectively. In this embodiment, bonding fingers are arranged into a first array and a second array in single file, and are arranged in a staggered pattern.

As illustrated in FIG. 9A, the rows of the bonding fingers 17 are disposed at a distance L3 and a distance L4 from the longer side of the slot 16. The bonding fingers 17 in the central area are staggered at the distances L3 and L4 from the side of the slot (edge). The bonding finger 17-13 is located at the distance L3 from the side of the slot (edge). The bonding fingers 17-21 and 17-22 are located at the distance L4 from the side of the slot (edge). The bonding fingers 17-11 and 17-12 in the slot end area are arrayed in single file at the distance L3 from the side of the slot (edge). The distance L3 is shorter than the distance L4, and the bonding fingers arrayed at the distance L3 constitute the first row, whereas the bonding fingers arrayed at the distance L4 constitute the second row.

The bonding fingers in each slot end area have the first array that has a bonding finger pitch A2 and that is at the distance L3 from the longer side of the slot. On the other hand, the bonding fingers in the central area have the second array at the distance L4 from the side of the slot (edge) and the first array at the distance L3 from the side of the slot (edge) in a staggered arrangement. The bonding finger pitch is A2 on both the first and second arrays. The pitch between a bonding finger at the distance L3 from the side of the slot (edge) and a bonding finger at the distance L4 from the side of the slot (edge) in the staggered arrangement is A2/2. In other words, the bonding finger pitch in which bonding fingers are staggered is half the bonding finger pitch in the respective arrays.

FIG. 9B is a conceptual diagram illustrating how bonding fingers are arrayed. The upper part of FIG. 9B illustrates for comparison a case in which bonding fingers are arranged into one row at a constant distance from the side of the slot. The lower part of FIG. 9B illustrates the bonding finger arrangement of this embodiment in which one row of bonding fingers is disposed in each slot end area, and two rows of bonding fingers are disposed in the central area in a staggered pattern so that the central area contains a mixture of first-row bonding fingers and second-row bonding fingers. In the upper part of FIG. 9B, an array distance (array length) from the array center point of the single-row bonding finger array to the bonding finger at one end of the array is denoted by X3. In the lower part of FIG. 9B, an array distance (array length) from the array center point of the single-row/double-row hybrid bonding finger array to the bonding finger at one end of the array is denoted by X4.

In the single-row/double-row hybrid bonding finger array illustrated in the lower part of FIG. 9B, the bonding finger pitch in the central area where bonding fingers are arrayed in a staggered pattern is halved at A2/2, and X4 is accordingly smaller than X3. The bonding finger array distance (array length) in the single-row/double-row hybrid bonding finger array illustrated in the lower part of FIG. 9B is therefore shorter than in the single-row bonding finger array by 2(X3−X4). By employing this bonding finger arrangement, the overall array distance may be made shorter. With the array distance shortened, the wire angle θ is small and meets the standards.

A semiconductor device with a wBGA package structure to which the single-row/double-row hybrid bonding finger array is applied is described with reference to FIGS. 10A and 10B, which are a plan view of the semiconductor device and a plan view of the semiconductor device that includes the wiring patterns 19, respectively.

In FIG. 10A, the central area circled by the broken line has the bonding fingers 17, which are provided for the die pads 14 on a one-on-one basis and a plurality of rows (two rows in the drawing) staggered relative to one another. Staggering the bonding fingers creates a level difference between adjacent bonding fingers and shortens the array interval (distance) between the bonding fingers. Bonding fingers C and D at the slot ends can therefore be disposed closer to the package center than when a single-row bonding finger array is employed. This means that the bonding fingers C and D are at a reduced distance from die pads to which the bonding fingers C and D are connected by bonding. The bonding wire angle θ can thus be contained within a range set by the standards.

The semiconductor device is described further with reference to FIG. 10B, which includes wiring patterns. The central area has the second array and part of the first array. In the central area, the bonding fingers 17 are staggered and the bonding wires 18 running from the die pads 14 to the bonding fingers 17 each have an angle of 0° or a slight tilt toward the substrate center. Further, the wiring patterns are connected from the bonding fingers to the solder balls by vertical or oblique wiring lines. With the vertical or oblique wiring patterns, necessary wiring can be laid out in the central area despite a narrow wiring area.

On the other hand, the slot end area has the part of first array which is close to the slot side. Here, the angle of the bonding wire extending from the die pad 14 to the bonding finger 17 is inclined toward the slot end. A wiring pattern that connects a bonding finger to its associated solder ball is led out in the horizontal direction once in order to pass through areas of in-between solder balls, and then connected to the associated solder ball in the vertical direction. Despite this, a wide wiring area can be secured in the slot end area by arranging the bonding fingers of the first array close to the slot. As a result, a large number of wiring patterns can be laid out.

In this embodiment, the bonding fingers in the central area are alternately disposed at the distances L3 and L4 from the side of the slot (edge) in a staggered pattern. The bonding fingers in each slot end area are arranged in single file at the distance L3 from the side of the slot (edge). Staggering the bonding fingers in the central area shortens the overall distance of the bonding finger array. Further, setting up the bonding fingers of the first array in the slot end areas closer to the side of the slot side widens the wiring areas between solder balls and bonding fingers. With the wiring areas set wide in the slot end areas where a large number of wiring lines are necessary to wire solder balls and bonding fingers to each other, a large number of wiring patterns can be laid out. Bonding wires that connect bonding fingers at the farthest ends to their associated die pads of the chip consequently have a small angle θ, and the design standards set for the angle θ can be satisfied easily.

In the embodiments described above, an array of bonding fingers on the substrate is disposed along each longer side of the slot and have a first bonding finger array and a second bonding finger array which are located on different rows from each other. The bonding fingers in each slot end area are contained in the first bonding finger array on a first row, which is located close to the side of the slot. The bonding fingers in the central area are contained in the second bonding finger array on a second row, which is located farther from the side of the slot with respect to at least the first row. By constituting an arrangement of bonding fingers with different arrays in the slot end area and the central area, respectively, the bonding finger interval can be narrowed at the border between the first bonding finger array of the slot end area on the first row and the second bonding finger array of the central area. The overall length of the bonding finger array in the longitudinal direction can thus be shortened and the bonding wire angle standard is satisfied. Further, by disposing the first bonding finger array closer to the side of the slot, a wide wiring area can be secured, and a large number of wiring patterns can be laid out in the slot end area.

The embodiments described above can provide a low-cost, multi-pin package substrate that can be reduced in size and a semiconductor device including the package substrate.

Exemplary embodiments of this invention have now been described. The invention of the present application, however, is not limited to the embodiments described above, and various changes and modifications can be made without departing from the scope and sprit of the invention.

What is claimed is:

1. A method comprising:
preparing a package substrate, the package substrate comprising:
a substrate with a slot that is selectively formed in the substrate to penetrate therethrough, the substrate thereby including a first edge defining a first side of the slot, the substrate further including a first bonding finger formation area in an end section of the first edge and a second bonding finger formation area in a central section of the first edge that is adjacent to the end section;
a first bonding finger array, wherein the first bonding finger formation area consists of the first bonding finger array that consists of a first line in which a plurality of first bonding fingers are arranged in line along the end section of the first edge at a first distance from the end section of the first edge; and
a second bonding finger array, wherein the second bonding finger formation area comprises the second bonding finger array, the second bonding finger array including a second line in which a plurality of second bonding fingers are arranged in line along the central section of the first edge at a second distance from the central section of the first edge, the second distance being greater than the first distance;
mounting a semiconductor chip, that comprises a plurality of die pads, on the package substrate such that the die pads are exposed by the slot of the substrate; and
connecting a plurality of bonding wires such that the die pads of the semiconductor chip are connected to the first and second bonding fingers, respectively, through the slot of the substrate.

2. The method as claimed in claim 1, wherein the second bonding finger array consists of the second line in which the second bonding fingers are arranged in line along the central section of the first edge at the second distance from the central section of the first edge.

3. The method as claimed in claim 1,
wherein the second bonding finger array further includes a third line in which a plurality of third bonding fingers are arranged in line along the central section of the first edge at the first distance from the central section of the first edge;
wherein the semiconductor chip further comprises a plurality of additional die pads that are exposed by the slot of the substrate; and
wherein the method further comprises connecting a plurality of additional bonding wires such that the additional die pads of the semiconductor chip are connected to the third bonding fingers, respectively, through the slot of the substrate.

4. The method as claimed in claim 3, wherein the second and third bonding fingers are arranged to stagger.

5. The method as claimed in claim 1, wherein the first boding fingers are arranged in line substantially at a first pitch and the second boding fingers are arranged in line substantially at a second pitch, the first pitch being substantially equal to the second pitch.

6. The method as claimed in claim 5, wherein an end one of the first boding fingers is disposed at a third pitch with respect an end one of the second bonding fingers, the third pitch is smaller than each of the first and second pitches.

7. The method as claimed in claim 1,
wherein the substrate further includes a third bonding finger formation area corresponding to a third portion of the first edge that is adjacent to the central section so that the second boding finger formation area is between the first and third bonding finger formation areas;
wherein the package substrate further comprises a third bonding finger array formed in the third bonding finger formation area, the third bonding finger array consisting of a third line in which a plurality of third bonding fingers are arranged in line along the third portion of the first edge at the first distance from the third portion of the first edge; and
wherein the semiconductor chip further comprises a plurality of first additional die pads that are exposed by the slot of the substrate; and
wherein the method further comprises connecting a plurality of additional bonding wires such that the first additional die pads of the semiconductor chip are connected to the third bonding fingers, respectively, through the slot of the substrate.

8. The method as claimed in claim 7, wherein the second bonding finger array consists of the second line in which the second bonding fingers are arranged in line along the central section of the first edge at the second distance from the central section of the first edge.

9. The method as claimed in claim 7,
wherein the second bonding finger array further includes a fourth line in which a plurality of fourth bonding fingers are arranged in line along the central section of the first edge at the first distance from the central section of the first edge;
wherein the semiconductor chip further comprises a plurality of second additional die pads that are exposed by the slot of the substrate; and
wherein the method further comprises connecting a plurality of second additional bonding wires such that the second additional die pads of the semiconductor chip are connected to the fourth bonding fingers, respectively, through the slot of the substrate.

10. The method as claimed in claim 9, wherein the second and fourth bonding fingers are arranged to stagger.

11. The method as claimed in claim 1,
wherein the substrate further includes a second edge defining a second side of the slot opposite to the first side, a third bonding finger formation area corresponding to a third portion of the second edge, and a fourth bonding finger formation area corresponding to a fourth portion of the second edge that is adjacent to the third portion;
wherein the package substrate further comprises:
a third bonding finger array formed in the third bonding finger formation area, the third bonding finger array consisting of a third line in which a plurality of third bonding fingers are arranged in line along the third portion of the second edge at the first distance from the third portion of the second edge, and
a fourth bonding finger array formed in the fourth bonding finger formation area, the fourth bonding finger array including a fourth line in which a plurality of fourth bonding fingers are arranged in line along the fourth portion of the second edge at the second distance from the fourth portion of the second edge;
wherein the semiconductor chip further comprises a plurality of first and second additional die pads that are exposed by the slot of the substrate; and
wherein the method further comprises connecting a plurality of first and second additional bonding wires, the first additional bonding wires connecting the first additional die pads to the third bonding fingers, respectively, through the slot of the substrate, and the second additional boding wires connecting the second additional die pads to the fourth bonding fingers, respectively, through the slot of the substrate.

12. The method as claimed in claim 11, wherein the second bonding finger array consists of the second line in which the second bonding fingers are arranged in line along the central section of the first edge at the second distance from the central section of the first edge, and the fourth bonding finger array consists of the fourth line in which the fourth bonding fingers are arranged in line along the fourth portion of the second edge at the second distance from the fourth portion of the second edge.

13. The method as claimed in claim 12,
wherein the substrate further includes:
a fifth bonding finger formation area corresponding to a fifth portion of the first edge that is adjacent to the central section so that the second boding finger formation area is between the first and fifth bonding finger formation areas; and
a sixth bonding finger formation area corresponding to a sixth portion of the second edge that is adjacent to the fourth portion so that the fourth boding finger formation area is between the third and sixth bonding finger formation areas
wherein the package substrate further comprises:
a fifth bonding finger array formed in the fifth bonding finger formation area, the fifth bonding finger array consisting of a fifth line in which a plurality of fifth bonding fingers are arranged in line along the fifth portion of the first edge at the first distance from the fifth portion of the first edge; and
a sixth bonding finger array formed in the sixth bonding finger formation area, the sixth bonding finger array consisting of a sixth line in which a plurality of sixth bonding fingers are arranged in line along the sixth portion of the second edge at the first distance from the sixth portion of the second edge;
wherein the semiconductor chip further comprises a plurality of third and fourth additional die pads that are exposed by the slot of the substrate; and
wherein the method further comprises connecting a plurality of third and fourth additional bonding wires, the third additional bonding wires connecting the third additional die pads to the fifth bonding fingers, respectively, through the slot of the substrate, and the fourth additional boding wires connecting the fourth additional die pads to the sixth bonding fingers, respectively, through the slot of the substrate.

14. The method as claimed in claim 11,
wherein the second bonding finger array further includes a fifth line in which a plurality of fifth bonding fingers are arranged in line along the central section of the first edge at the first distance from the central section of the first edge;
wherein the fourth bonding finger array further includes a sixth line in which a plurality of sixth bonding fingers are arranged in line along the fourth portion of the second edge at the second distance from the fourth portion of the second edge;
wherein the semiconductor chip further comprises a plurality of third and fourth additional die pads that are exposed by the slot of the substrate; and
wherein the method further comprises connecting a plurality of third and fourth additional bonding wires, the third additional bonding wires connecting the third additional die pads to the fifth bonding fingers, respectively, through the slot of the substrate, and the fourth additional boding wires connecting the fourth additional die pads to the sixth bonding fingers, respectively, through the slot of the substrate.

15. The method as claimed in claim 14, wherein the second and fifth bonding fingers are arranged to stagger, and the fourth and sixth bonding fingers are arranged to stagger.

16. The method as claimed in claim 14,
wherein the substrate further includes:
a fifth bonding finger formation area corresponding to a fifth portion of the first edge that is adjacent to the central section so that the second boding finger formation area is between the first and fifth bonding finger formation areas; and
a sixth bonding finger formation area corresponding to a sixth portion of the second edge that is adjacent to the fourth portion so that the fourth boding finger formation area is between the third and sixth bonding finger formation areas
wherein the package substrate further comprises:
a seventh bonding finger array formed in the fifth bonding finger formation area, the seventh bonding finger array consisting of a seventh line in which a plurality of seventh bonding fingers are arranged in line along the fifth portion of the first edge at the first distance from the fifth portion of the first edge; and an eighth bonding finger array formed in the sixth bonding finger formation area, the eighth bonding finger array consisting of an eighth line in which a plurality of eighth bonding fingers are arranged in line along the sixth portion of the second edge at the first distance from the sixth portion of the second edge;

wherein the semiconductor chip further comprises a plurality of fifth and sixth additional die pads that are exposed by the slot of the substrate; and wherein the method further comprises connecting a plurality of fifth and sixth additional bonding wires, the fifth additional bonding wires connecting the fifth additional die pads to the seventh bonding fingers, respectively, through the slot of the substrate, and the sixth additional boding wires connecting the sixth additional die pads to the eighth bonding fingers, respectively, through the slot of the substrate.

* * * * *